United States Patent
Qi et al.

(10) Patent No.: US 11,276,573 B2
(45) Date of Patent: Mar. 15, 2022

(54) METHODS OF FORMING HIGH BORON-CONTENT HARD MASK MATERIALS

(71) Applicant: Applied Materials, Inc., Santa Clara, CA (US)

(72) Inventors: Bo Qi, San Jose, CA (US); Zeqing Shen, San Jose, CA (US); Abhijit Mallick, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 97 days.

(21) Appl. No.: 16/703,248

(22) Filed: Dec. 4, 2019

(65) Prior Publication Data

US 2021/0175078 A1    Jun. 10, 2021

(51) Int. Cl.
   *H01L 21/44* (2006.01)
   *H01L 21/033* (2006.01)
   (Continued)

(52) U.S. Cl.
   CPC ......... *H01L 21/0337* (2013.01); *C23C 16/28* (2013.01); *C23C 16/50* (2013.01); *H01L 21/0332* (2013.01)

(58) Field of Classification Search
   CPC . H01L 21/0337; H01L 21/0332; C23C 16/28; C23C 16/50
   See application file for complete search history.

(56) References Cited

U.S. PATENT DOCUMENTS

| | | | |
|---|---|---|---|
| 7,361,611 B2* | 4/2008 | Chakravarti | ........ H01L 21/0214 438/778 |
| 7,704,816 B2* | 4/2010 | Huh | ...................... H01L 21/314 438/197 |

(Continued)

FOREIGN PATENT DOCUMENTS

TW    201945827 A    12/2019

OTHER PUBLICATIONS

International Search Report and Written Opinion dated Mar. 26, 2021 in International Patent Application No. PCT/US2020/62648, 9 pages.

(Continued)

*Primary Examiner* — Caleb E Henry
(74) *Attorney, Agent, or Firm* — Kilpatrick Townsend & Stockton LLP

(57) ABSTRACT

An exemplary method may include delivering a boron-containing precursor to a processing region of a semiconductor processing chamber. The method may also include forming a plasma within the processing region of the semiconductor processing chamber from the boron-containing precursor. The method may further include depositing a boron-containing material on a substrate disposed within the processing region of the semiconductor processing chamber. The boron-containing material may include greater than 50% of boron. In some embodiments, the boron-containing material may include substantially all boron. In some embodiments, the method may further include delivering at least one of a germanium-containing precursor, an oxygen-containing precursor, a silicon-containing precursor, a phosphorus-containing precursor, a carbon-containing precursor, and/or a nitrogen-containing precursor to the processing region of the semiconductor processing chamber. The boron-containing material may further include at least one of (Continued)

germanium, oxygen, silicon, phosphorus, carbon, and/or nitrogen.

17 Claims, 3 Drawing Sheets

(51) Int. Cl.
    *C23C 16/28*     (2006.01)
    *C23C 16/50*     (2006.01)

(56) References Cited

U.S. PATENT DOCUMENTS

| | | | |
|---|---|---|---|
| 8,178,443 B2 * | 5/2012 | Rangarajan | H01L 21/3148 438/704 |
| 8,536,073 B2 * | 9/2013 | Rangarajan | H01L 21/31144 438/694 |
| 9,090,969 B2 * | 7/2015 | Takeda | H01L 21/0262 |
| 9,337,068 B2 * | 5/2016 | Antonelli | H01L 21/02274 |
| 9,837,270 B1 * | 12/2017 | Varadarajan | H01L 21/02274 |
| 10,301,719 B1 | 5/2019 | Paquette et al. | |
| 2010/0233633 A1 | 9/2010 | Nguyen et al. | |
| 2011/0135557 A1 * | 6/2011 | Rangarajan | H01L 21/31144 423/345 |
| 2013/0330932 A1 | 12/2013 | Rangarajan et al. | |
| 2016/0307766 A1 * | 10/2016 | Jongbloed | H01L 21/3115 |
| 2017/0207088 A1 | 7/2017 | Kwon et al. | |
| 2018/0330939 A1 | 11/2018 | Pore | |

OTHER PUBLICATIONS

Dhungana. S., et al., "Boron and high-k dielectrics: Possible fourth etch stop colors for multipattern optical lithography processing" ,Journal of Vacuum Science & Technology A: American Vacuum, Surfaces, and Films, vol. 35, Issue 2, (year 2017), 35 pages, DOI:10.1116/1.4974920.

* cited by examiner

METHODS OF FORMING HIGH BORON-CONTENT HARD MASK MATERIALS

TECHNICAL FIELD

The present technology relates to semiconductor processing and materials. More specifically, the present technology relates to high boron-content hard mask materials and processes involving the same.

BACKGROUND

Integrated circuits are made possible by processes which produce intricately patterned material layers on substrate surfaces. Producing patterned material on a substrate requires controlled methods of formation and removal of exposed material. Thus, there is a need for materials and processes that can be used to facilitate the formation and removal of exposed materials to produce patterned features and structures. These and other needs are addressed by the present technology.

SUMMARY

Embodiments of the present technology may include methods for forming hard masks. In some embodiments, an exemplary method may include delivering a boron-containing precursor to a processing region of a semiconductor processing chamber. The method may also include forming a plasma within the processing region of the semiconductor processing chamber from the boron-containing precursor. The method may further include depositing a boron-containing material on a substrate disposed within the processing region of the semiconductor processing chamber. The boron-containing material may include greater than 50% of boron.

In some embodiments, the boron-containing material may include substantially all boron. In some embodiments, the boron-containing material may include only boron and hydrogen. In some embodiments, the boron-containing material may not include silicon.

In some embodiments, the method may further include delivering a germanium-containing precursor to the processing region of the semiconductor processing chamber. Forming the plasma within the processing region of the semiconductor processing chamber further may include forming the plasma within the processing region of the semiconductor processing chamber from the germanium-containing precursor. The boron-containing material further may include less than 20% of germanium.

In some embodiments, the method may further include delivering an oxygen-containing precursor to the processing region of the semiconductor processing chamber. Forming the plasma within the processing region of the semiconductor processing chamber further may include forming the plasma within the processing region of the semiconductor processing chamber from the oxygen-containing precursor. The boron-containing material further may include less than 20% of oxygen. In some embodiments, the boron-containing material may be characterized by an extinction coefficient of less than 0.3.

In some embodiments, the method may further include delivering a silicon-containing precursor to the processing region of the semiconductor processing chamber. Forming the plasma within the processing region of the semiconductor processing chamber further may include forming the plasma within the processing region of the semiconductor processing chamber from the silicon-containing precursor. The boron-containing material further may include less than 5% of silicon.

In some embodiments, the method may further include delivering a carbon-containing precursor to the processing region of the semiconductor processing chamber. Forming the plasma within the processing region of the semiconductor processing chamber may further include forming the plasma within the processing region of the semiconductor processing chamber from the carbon-containing precursor. The boron-containing material further may include less than 10% of carbon.

In some embodiments, the method may further include delivering a nitrogen-containing precursor to the processing region of the semiconductor processing chamber. Forming the plasma within the processing region of the semiconductor processing chamber may further include forming the plasma within the processing region of the semiconductor processing chamber from the nitrogen-containing precursor. The boron-containing material further may include less than 10% of nitrogen.

In some embodiments, the method may further include delivering a phosphorus-containing precursor to the processing region of the semiconductor processing chamber. Forming the plasma within the processing region of the semiconductor processing chamber may further include forming the plasma within the processing region of the semiconductor processing chamber from the phosphorus-containing precursor. The boron-containing material further may include less than 10% of phosphorus.

In some embodiments, the boron-containing precursor may be a first precursor. The method may further include delivering a second precursor to the processing region of the semiconductor processing chamber. The second precursor may include at least one of a germanium-containing precursor, an oxygen-containing precursor, a silicon-containing precursor, a carbon-containing precursor, a nitrogen-containing precursor, or a phosphorus-containing precursor. Forming the plasma within the processing region of the semiconductor processing chamber may further include forming the plasma within the processing region of the semiconductor processing chamber from the second precursor. The boron-containing material may further include less than 20% or less than 10% of germanium, oxygen, silicon, carbon, nitrogen, or phosphorus.

In some embodiments, the boron-containing material may have an etch selectivity greater than 1.5:1 relative to amorphous silicon. In some embodiments, the boron-containing material may have an etch selectivity greater than 1.5:1 relative to a silicon-doped boron hard mask material that may include about 30% of silicon and about 65% of boron. In some embodiments, the boron-containing material may be deposited at a deposition rate greater than or about 5,000 Å/minute. In some embodiments, a temperature within the processing region of the semiconductor processing chamber may be maintained between about 400° C. and about 550° C.

In some embodiments, the method may further include delivering a precursor containing nitrogen and hydrogen into the processing region of the semiconductor processing chamber. In some embodiments, the method may also include forming a plasma from the precursor containing nitrogen and hydrogen. The method may further include treating the boron-containing material with the plasma formed from the precursor containing nitrogen and hydrogen. In some embodiments, the method may further include heating the boron-containing material to a temperature ranging between about 500° C. and about 650° C. for a period between about 1 second and about 60 minutes.

In some embodiments, another exemplary method may include delivering a boron-containing precursor to a processing region of a semiconductor processing chamber. The method may also include forming a plasma within the processing region of the semiconductor processing chamber from the boron-containing precursor. The method may further include depositing a boron-containing material on a substrate disposed within the processing region of the semiconductor processing chamber. The boron-containing material may include greater than 50% of boron. The boron-containing material may be configured to be etched to form a high aspect ratio feature.

In some embodiments, the method may further include delivering a germanium-containing precursor to the processing region of the semiconductor processing chamber. Forming the plasma within the processing region of the semiconductor processing chamber further may include forming the plasma within the processing region of the semiconductor processing chamber from the germanium-containing precursor. The boron-containing material further may include less than 20% of germanium.

In some embodiments, the method may further include delivering an oxygen-containing precursor to the processing region of the semiconductor processing chamber. Forming the plasma within the processing region of the semiconductor processing chamber further may include forming the plasma within the processing region of the semiconductor processing chamber from the oxygen-containing precursor. The boron-containing material further may include less than 20% of oxygen.

The present technology may provide numerous benefits over conventional systems and techniques. For example, the present technology may provide hard mask materials that may offer improved etch selectivity and reduced extinction coefficients that may facilitate the lithography and etching processes. Additionally, the present technology may improve the mechanical properties of the hard masks formed while allowing for high deposition rates. Thus, the present technology may not only improve the properties of the hard masks deposited, but may also improve the production efficiency. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
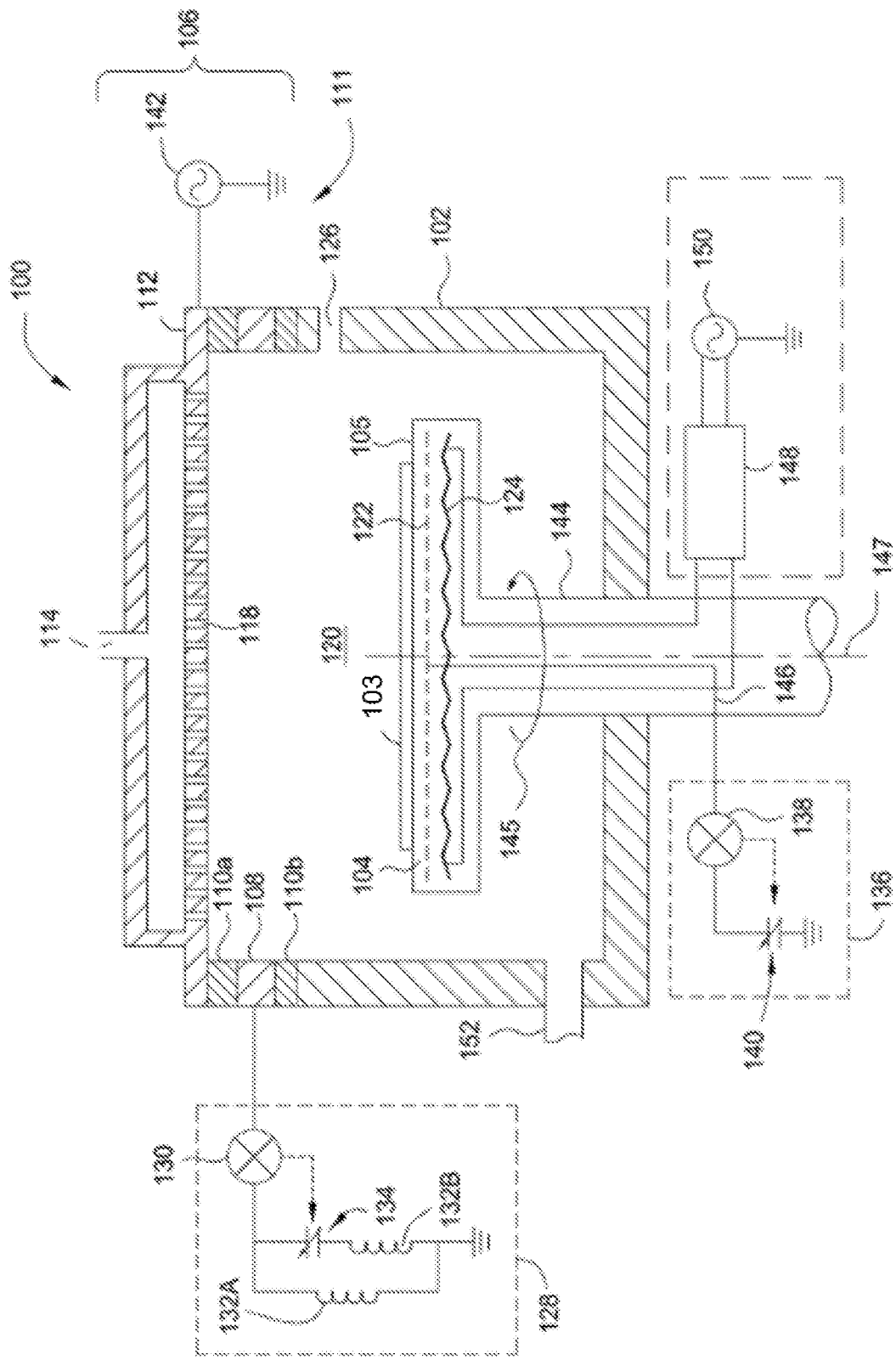
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor processing, structures may be produced on a substrate utilizing a variety of deposition and etching operations. Mask materials, including hard mask materials, may be used to allow materials to be selectively etched to produce features across the substrate. For example, thermally produced amorphous silicon hard mask has been utilized to facilitate semiconductor fabrication. However, the thermally produced amorphous silicon hard mask may be relatively thick due to the relatively low etch selectivity offered by the thermally produced amorphous silicon. As the feature size of semiconductor devices continues to decrease, increased film thickness, such as the hard mask thickness formed of amorphous silicon, may lead to other processing challenges. For example, increased hard mask film thickness may require etching features having high aspect ratios, which may lead to non-uniform top to bottom etching. Additionally, increased hard mask film thickness may also cause the hard mask to be less transparent, which may be characterized by a relatively high extinction coefficient. Hard masks with relatively high extinction coefficients can pose challenges to the alignment between structures produced via different patterning, etching, and/or deposition processes.

The present technology solves these and other issues by providing various high boron-content materials that may improve etch selectivity, reduce extinction coefficients, increase deposition rates, and/or provide other benefits by incorporating a high content of boron in the hard masks. The present technology may further improve the various properties of the hard masks by doping the high boron-content hard mask materials with various elements, facilitating the use of the hard mask material in various applications, including one cylinder storage (OCS) etch for DRAM fabrication where deep and narrow etch through the hard mask may be performed. After describing general aspects of a chamber according to embodiments of the present technology in which plasma processing operations discussed below may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the RF generator may include a capacitively coupled plasma source. In some embodiments, the RF generator may include an inductively coupled plasma source. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
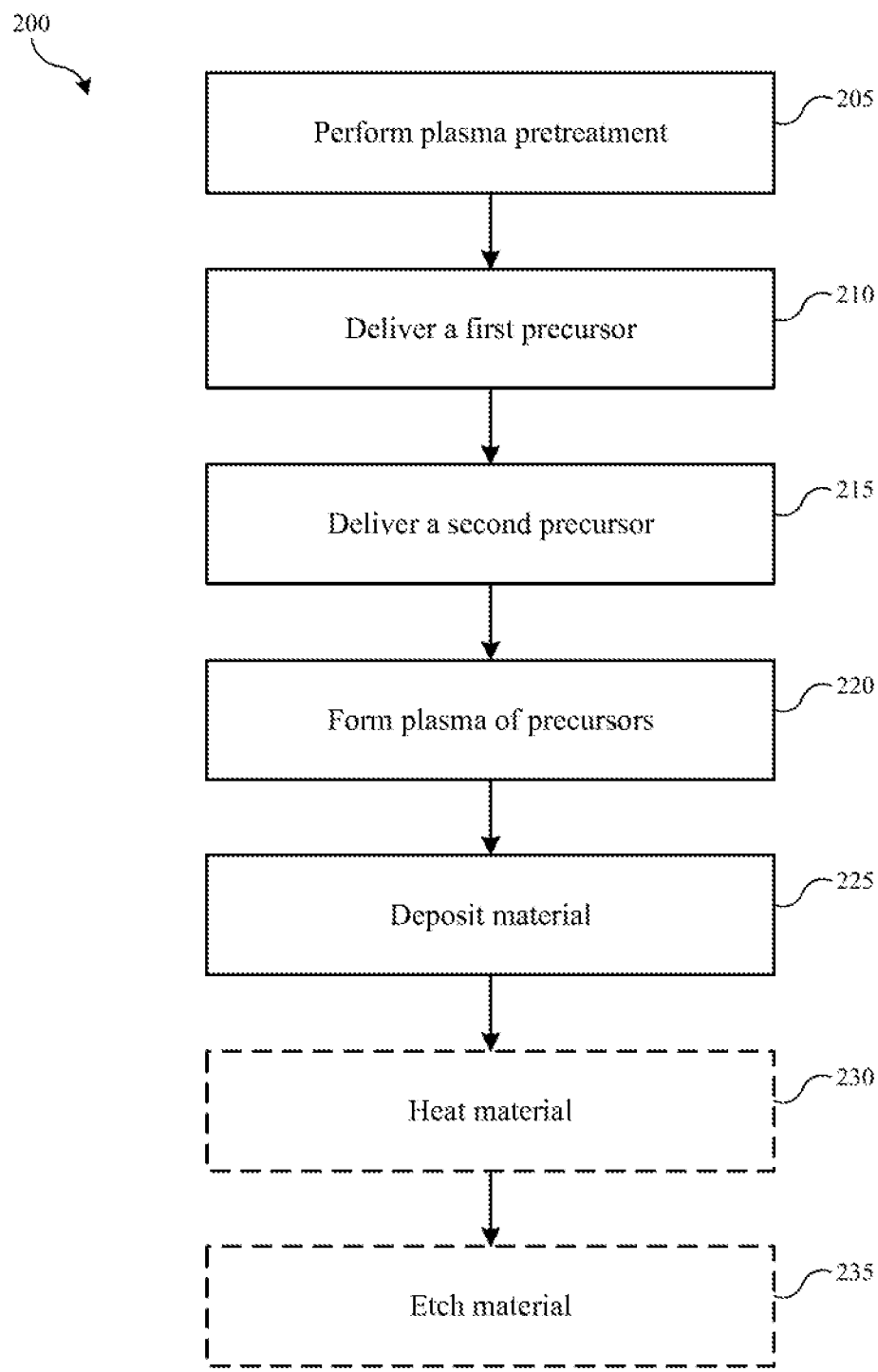
FIG. 2 shows exemplary operations in a semiconductor substrate processing method according to some embodiments of the present technology.

FIG. 2 shows exemplary operations in a semiconductor substrate processing method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3A-3D, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
FIGS. 3A-3D schematically illustrate exemplary semiconductor structures that may be processed using the operations shown in FIG. 2 according to some embodiments of the present technology.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above. An exemplary substrate 305 is illustrated in FIG. 3A. The substrate 305 may include nitride, oxide, carbide, or any other film or layer that may be useful in semiconductor processing. Although only a single layer is shown in FIG. 3A, the substrate 305 may include one or more additional layers.

In some embodiments, the substrate 305 may be pretreated. For example, at operation 205, a hydrogen-and-nitrogen-containing precursor, such as ammonia, and/or a combination of a nitrogen-containing precursor, such as dinitrogen, and a hydrogen-containing precursor, such as diatomic hydrogen, may be flowed into the processing region of the processing chamber to form a plasma to pretreat the substrate 305. Such pretreatment may improve the adhesion of a subsequently deposited hard mask to the substrate 305. Without intending to be bound to particular theory, the improved adhesion may be achieved partly due to the nitrogen implantation into the substrate 305 or a nitride that may be formed by the nitrogen and the substrate material, such as silicon nitride. The implanted nitrogen and/or formed nitride may modify the lattice constant of the substrate 305 to be closer to a lattice constant of the hard mask material to be deposited, such as a boron-containing hard mask material. Improved lattice match may improve adhesion of the hard mask material to the substrate 305. The improved adhesion may also be achieved partly due to a hydrogen-terminated surface, such as a hydrogen-terminated silicon surface, that may be formed. The improved adhesion may reduce or eliminate peeling or cracking of the deposited hard mask during subsequent heating of the hard mask as will be discussed in more detail below. Upon completion of the pretreatment, the processing region may be purged to remove any residual hydrogen-and-nitrogen-containing precursor, nitrogen-containing precursor, and/or hydrogen-containing precursor.

At operation 210, a first precursor, such as a boron-containing precursor, may be delivered to the processing region of the processing chamber. Depending on the applications, in some embodiments, method 200 may further include, at operation 215, delivering a second precursor to the processing region of the processing chamber. For example, in some embodiments, a hard mask containing germanium and boron may be appropriate for certain applications. Thus, at operation 215, a germanium-containing precursor may be delivered into the processing region of the chamber. In some embodiments, a hard mask containing oxygen and boron may be appropriate for certain applications. Thus, at operation 215, an oxygen-containing precursor may be delivered into the processing region of the processing chamber. In some embodiments, a hard mask containing silicon and boron may be appropriate for certain applications. Thus, at operation 215, a silicon-containing precursor may be delivered into the processing region of the chamber. In some embodiments, a hard mask containing carbon and boron may be appropriate for certain applications. Thus, at operation 215, a carbon-containing precursor may be delivered into the processing region of the chamber. In some embodiments, a hard mask containing nitrogen and boron may be appropriate for certain applications. Thus, at operation 215, a nitrogen-containing precursor may be delivered into the processing region of the chamber. In some embodiments, a hard mask containing phosphorus and boron may be appropriate for certain applications. Thus, at operation 215, a phosphorus-containing precursor may be delivered into the processing region of the chamber.

Depending on the particular applications, various other precursors may be delivered into the processing region to form a hard mask with appropriate elemental compositions. In some embodiments, operation 215 may be omitted. Thus, the hard mask formed may not include silicon, germanium, oxygen, carbon, nitrogen, or phosphorus. The hard mask formed may include substantially all boron, although a small amount of hydrogen may be incorporated as will be discussed below. Although the elemental composition of the hard mask may vary depending on the application, the hard mask described herein may generally include a high content of boron, e.g., greater than 50%, greater than or about 55%, greater than or about 60%, greater than or about 65%, greater than or about 70%, greater than or about 75%, greater than or about 80%, greater than or about 85%, greater than or about 90%, greater than or about 95%, greater than or about 96%, greater than or about 97%, greater than or about 98%, greater than or about 99%, or greater. By increasing the boron content, e.g., increasing the boron content to greater than 50%, increased optical transparency which may be characterized by decreased extinction coefficients, increased deposition rate, increased etch selectivity, and/or other improved hard mask properties, may be achieved. When the boron content may be less than 50%, one or more the above-mentioned properties of the hard mask, such as high optical transparency, low extinction coefficients, high deposition rate, high etch selectivity, etc., may not be achieved.

In some embodiments, one or more of the precursors may be diluted by a dilution gas to achieve different levels of incorporation of various elements in the hard mask. In some embodiments, the dilution gas may include a hydrogen-containing dilution gas, such as diatomic hydrogen. The dilution gas may be mixed with one or more of the precursors to adjust the concentration of one or more of the precursors delivered into the processing chamber. Various incorporations of each element in the hard mask may thus be achieved for different applications. In some embodiments, the dilution gas may be mixed with one or more of the boron-containing precursor, the germanium-containing precursor, the oxygen-containing precursor, the carbon-containing precursor, the nitrogen-containing precursor, and/or the phosphorus-containing precursor, prior to delivering the precursors into the processing chamber to achieve desired concentration or incorporation of boron, germanium, oxygen, carbon, nitrogen, and/or phosphorous in the hard mask. In some embodiments, the dilution gas may be flowed into the processing region of the processing chamber separately without mixing with the one or more precursors. By mixing the dilution gas with one or more of the precursors prior to delivery into the processing chamber and/or delivering the dilution gas separately into the processing chamber, the flow rates of various precursors and/or the dilution gas may be controlled to limit the change in the overall flow rate and/or to limit disturbance to the deposition condition inside the processing chamber for enhanced film quality.

In some embodiments, plasma enhanced deposition, such as plasma enhanced chemical vapor deposition, may be performed in some embodiments of the present technology. For example, at operation 220, the delivered precursors may all be used to form a plasma within the processing region of the processing chamber, which may facilitate material reactions and deposition. In some embodiments, a plasma of an inert gas, such as argon, helium, or other inert gases, may be formed in the processing region prior to delivering one or more of the precursors at operations 210, 215. Thus, when the precursors may be delivered into the processing region, the precursors may be excited by the plasma to facilitate reactions and deposition process. Forming an inert gas plasma prior to delivering the precursors may provide better control of the plasma power when the precursors may be initially excited and thus may improve the quality of the hard mask deposited.

Figure 3B:
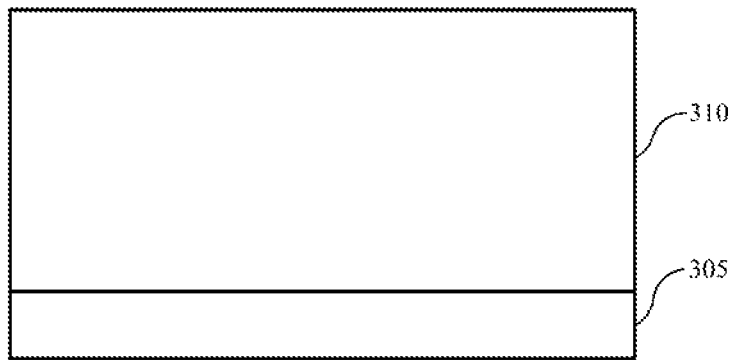

At operation 225, a hard mask layer 310 may be deposited on the substrate 305, such as shown in FIG. 3B. Depending on the precursors delivered, the hard mask layer 310 may include or incorporate one or more of boron, germanium, oxygen, silicon, carbon, nitrogen, phosphorus, and/or hydrogen. In some embodiments, the hard mask layer 310 may include substantially only boron. For example, the hard mask layer 310 may include at least 80% of boron. In some embodiments, the amount of boron included or incorporated in the hard mask layer 310 may be greater than or about 80%, greater than or about 82%, greater than or about 84%, greater than or about 86%, greater than or about 88%, greater than or about 90%, greater than or about 92%, greater than or about 94%, greater than or about 96%, greater than or about 98%, greater than or about 99% of boron, or greater. In some embodiments, the hard mask layer 310 may include 100% boron. As will be further discussed below, increased content or incorporation of boron may increase the etch selectivity of the hard mask layer 310, among other things.

In some embodiments, the hard mask layer 310 may include germanium and boron. The hard mask layer 310 may include a greater content of boron than germanium, and thus the hard mask may also be referred to as germanium-doped boron hard mask. Depending on the application, the hard mask layer 310 may include no greater than 20% of germanium. In some embodiments, the amount of germanium included or incorporated in the hard mask layer 310 may be less than or about 20%, less than or about 18%, less than or about 16%, less than or about 14%, less than or about 12%, less than or about 10%, less than or about 9%, less than or about 8%, less than or about 7%, less than or about 6%, less than or about 5%, less than or about 4%, less than or about 3%, less than or about 2%, less than or about 1%, or less. In some embodiments, the amount of boron included or incorporated in the hard mask layer 310 that may include both germanium and boron may be at least 80%, and may be greater than or about 80%, greater than or about 82%, greater than or about 84%, greater than or about 86%, greater than or about 88%, greater than or about 90%, greater than or about 91%, greater than or about 92%, greater than or about 93%, greater than or about 94%, greater than or about 95%, greater than or about 96%, greater than or about 97%, greater than or about 98%, greater than or about 99%, or greater. As will be further discussed below, by incorporating germanium, improved etch selectivity, further reduced extinction coefficient, and/or other advantages of the hard mask layer 310 may be obtained.

In some embodiments, the hard mask layer 310 may include oxygen and boron. The hard mask layer 310 may include a greater content of boron than oxygen, and thus the hard mask may also be referred to as oxygen-doped boron hard mask. Depending on the application, the hard mask layer 310 may include no greater than 20% of oxygen. In some embodiments, the amount of oxygen included or incorporated in the hard mask layer 310 may be less than or about 20%, less than or about 18%, less than or about 16%, less than or about 14%, less than or about 12%, less than or about 10%, less than or about 9%, less than or about 8%, less than or about 7%, less than or about 6%, less than or about 5%, less than or about 4%, less than or about 3%, less than or about 2%, less than or about 1%, or less. In some embodiments, the amount of boron included or incorporated in the hard mask layer 310 that may include both oxygen and boron may be at least 80%, and may be greater than or about 80%, greater than or about 82%, greater than or about 84%, greater than or about 86%, greater than or about 88%, greater than or about 90%, greater than or about 91%, greater than or about 92%, greater than or about 93%, greater than or about 94%, greater than or about 95%, greater than or about 96%, greater than or about 97%, greater than or about 98%, greater than or about 99%, or greater. As will be further discussed below, incorporating oxygen in the high boron-content hard mask material may further reduce extinction coefficient, among other things.

In some embodiments, the hard mask layer 310 may include silicon and boron. The hard mask layer 310 may include a much greater content of boron than silicon, and the hard mask may also be referred to as silicon-doped high boron-content hard mask. Depending on the application, the hard mask layer 310 may include no greater than 5% of silicon. In some embodiments, the amount of silicon included or incorporated in the hard mask layer 310 may be less than or about 5%, less than or about 4.5%, less than or about 4%, less than or about 3.5%, less than or about 3%, less than or about 2.5%, less than or about 2%, less than or about 1.5%, less than or about 1%, less than or about 0.75%, less than or about 0.5%, less than or about 0.25%, or less. In some embodiments, the amount of boron included or incorporated in the silicon-doped high boron-content hard mask layer 310 may be at least 80%, and may be greater than or about 80%, greater than or about 82%, greater than or about 84%, greater than or about 86%, greater than or about 88%, greater than or about 90%, greater than or about 91%, greater than or about 92%, greater than or about 93%, greater than or about 94%, greater than or about 95%, greater than or about 96%, greater than or about 97%, greater than or about 98%, greater than or about 99%, or greater. The remainder of the hard mask layer 310 may include a minor amount of hydrogen.

In some embodiments, the hard mask layer 310 may include carbon and boron. The hard mask layer 310 may include a greater content of boron than carbon, and thus the hard mask may also be referred to as carbon-doped boron hard mask. Depending on the application, the hard mask layer 310 may include no greater than 10% of carbon. In some embodiments, the amount of carbon included or incorporated in the hard mask layer 310 may be less than or about 10%, less than or about 9%, less than or about 8%, less than or about 7%, less than or about 6%, less than or about 5%, less than or about 4%, less than or about 3%, less than or about 2%, less than or about 1%, or less. In some embodiments, the amount of boron included or incorporated in the hard mask layer 310 that may include both carbon and boron may be at least 80%, and may be greater than or about 80%, greater than or about 82%, greater than or about 84%, greater than or about 86%, greater than or about 88%, greater than or about 90%, greater than or about 91%, greater than or about 92%, greater than or about 93%, greater than or about 94%, greater than or about 95%, greater than or about 96%, greater than or about 97%, greater than or about 98%, greater than or about 99%, or greater. The remainder of the hard mask layer 310 may include a minor amount of hydrogen.

In some embodiments, the hard mask layer 310 may include nitrogen and boron. The hard mask layer 310 may include a greater content of boron than nitrogen, and thus the hard mask may also be referred to as nitrogen-doped boron hard mask. Depending on the application, the hard mask layer 310 may include no greater than 10% of nitrogen. In some embodiments, the amount of nitrogen included or incorporated in the hard mask layer 310 may be less than or about 10%, less than or about 9%, less than or about 8%, less than or about 7%, less than or about 6%, less than or about 5%, less than or about 4%, less than or about 3%, less than or about 2%, less than or about 1%, or less. In some embodiments, the amount of boron included or incorporated in the hard mask layer 310 that may include both nitrogen and boron may be at least 80%, and may be greater than or about 80%, greater than or about 82%, greater than or about 84%, greater than or about 86%, greater than or about 88%, greater than or about 90%, greater than or about 91%, greater than or about 92%, greater than or about 93%, greater than or about 94%, greater than or about 95%, greater than or about 96%, greater than or about 97%, greater than or about 98%, greater than or about 99%, or greater. The remainder of the hard mask layer 310 may include a minor amount of hydrogen.

In some embodiments, the hard mask layer 310 may include phosphorus and boron. The hard mask layer 310 may include a greater content of boron than phosphorus, and thus the hard mask may also be referred to as phosphorus-doped boron hard mask. Depending on the application, the hard mask layer 310 may include no greater than 10% of phosphorus. In some embodiments, the amount of phosphorus included or incorporated in the hard mask layer 310 may be less than or about 10%, less than or about 9%, less than or about 8%, less than or about 7%, less than or about 6%, less than or about 5%, less than or about 4%, less than or about 3%, less than or about 2%, less than or about 1%, or less. In some embodiments, the amount of boron included or incorporated in the hard mask layer 310 that may include both phosphorus and boron may be at least 80%, and may be greater than or about 80%, greater than or about 82%, greater than or about 84%, greater than or about 86%, greater than or about 88%, greater than or about 90%, greater than or about 91%, greater than or about 92%, greater than or about 93%, greater than or about 94%, greater than or about 95%, greater than or about 96%, greater than or about 97%, greater than or about 98%, greater than or about 99%, or greater. The remainder of the hard mask layer 310 may include a minor amount of hydrogen.

In some embodiments, when hydrogen may be used as the dilution gas, the hard mask layer 310 may further include a relatively small amount of hydrogen, e.g., no more than 20% of hydrogen. In some embodiments, the amount of hydrogen included or incorporated in the hard mask layer 310 may be less than or about 20%, less than or about 18%, less than or about 16%, less than or about 14%, less than or about 12%, less than or about 10%, less than or about 9%, less than or about 8%, less than or about 7%, less than or about 6%, less than or about 5%, less than or about 4%, less than or about 3%, less than or about 2%, less than or about 1%, less than or about 0.8%, less than or about 0.6%, less than or about 0.4%, less than or about 0.2%, less than or about 0.1%, or less. In some embodiments, the hard mask layer 310 may not include hydrogen.

In some embodiments, an optional or additional heating operation 230 may be performed. In some embodiments, the heating operation 230 may be performed to reduce the hydrogen content in the hard mask deposited. In some embodiments, the deposited hard mask may be subjected to a higher temperature, and thus heated, during subsequent operations for other processing needs, such as deposition and/or etching operations for forming structures on the substrate 305. As discussed above, in some embodiments, prior to depositing the hard mask layer 310, a pretreatment operation, such as the pretreatment operation 205 discussed above, may be performed to improve adhesion between the hard mask layer 310 and the substrate 305. By performing the pretreatment operation, during subsequent heating or when the hard mask layer may be subjected to a relatively high temperature, peeling or cracking may be prevented. Depending on the application, the substrate 305, including the hard mask layer 310, may be heated to a temperature greater than or about 500° C., greater than or about 550° C., greater than or about 600° C., greater than or about 650° C., or greater. The hard mask layer 310 may be heated for a period between about 1 second and about 60 minutes, between about 10 seconds and about 30 minutes, between about 30 seconds and about 10 minutes, or between about 1 minute and about 5 minutes. In some embodiments, the hard mask layer 310 may be heated for a period between about 5 minutes and about 55 minutes, between about 10 minutes and about 50 minutes, between about 15 minutes and about 45 minutes, between about 20 minutes and about 40 minutes, or between about 25 minutes and about 35 minutes. The hard mask layer 310 with the one or more elemental compositions described herein may exhibit no cracking lines in the deposited hard mask layer, and/or no peeling may be observed upon completion of the heating operation. For example, when the hard mask containing substantially pure boron may be heated at about 600° C. for a period of about 30 minutes, no peeling or cracking lines may be observed in the deposited hard mask layer. Thus, the hard mask layer 310 described herein may demonstrate good thermal stability and offer good adhesion, which may be beneficial when the substrate 305 may be subsequently heated during various other processing operations.

Figure 3C:
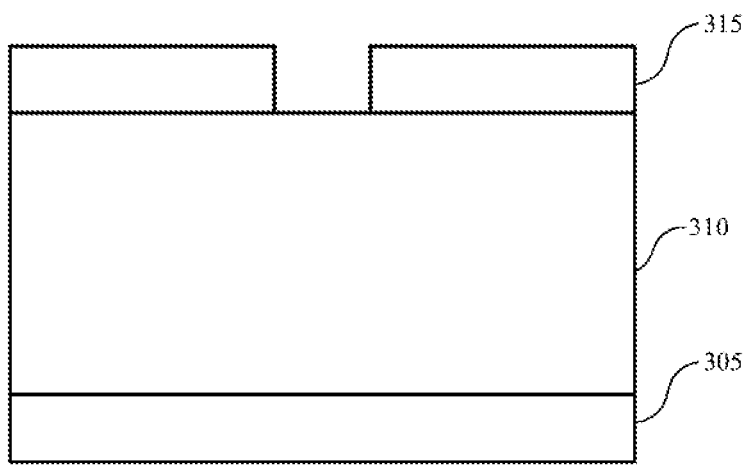
Figure 3D:
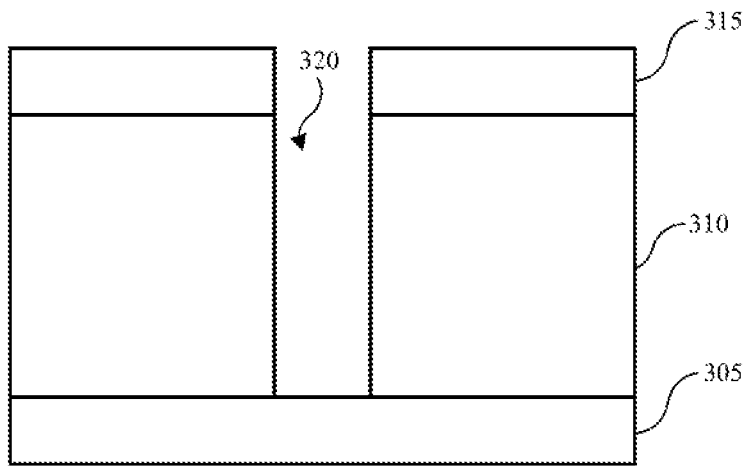

In some embodiments, method 200 may optionally or additionally include, at operation 235, forming an etch pattern 315 on top of the hard mask layer 310, such as shown in FIG. 3C, and etching the hard mask layer 310 to create a hole 320 in the hard mask layer 310, such as shown in FIG. 3D. In some embodiments, the etch pattern 315 may be subsequently removed, and the etched hard mask layer 310 may be utilized to etch one or more layers below the hard mask layer 310 on the substrate 305. Although only one hole 320 is shown in FIG. 3D, depending on the application, there may be more than one hole 320 etched in the hard mask layer 310, and in some embodiments, there may be tens, hundreds, or thousands of holes similar to the etched hole 320 shown in FIG. 3D. The etched holes may be characterized by very high aspect ratios or height to width ratios, e.g., greater than or about 10:1. In some embodiments, the aspect ratios of the etched holes may be greater than or about 20:1, greater than or about 50:1, greater than or about 75:1, greater than or about 100:1, or even greater.

Conventional hard mask materials, such as amorphous silicon, have difficulty in achieving uniform etching from the top to the bottom of the etched holes due to the relatively low etch selectivity offered by the conventional hard mask materials. The hard mask materials described herein demonstrate improved etch selectivity over conventional hard mask materials and thus may allow for uniform top to bottom etching. For example, the various hard mask materials described herein may have an etch selectivity relative to amorphous silicon that may be greater than or about 1.5:1, greater than or about 2:1, greater than or about 2.5:1, greater than or about 3:1, greater than or about 3.5:1, greater than or about 4:1, greater than or about 4.5:1, greater than or about 5:1, or greater.

Further, the inventors have observed that by increasing boron content and/or doping boron with appropriate dopants, such as germanium, oxygen, carbon, nitrogen, phosphorus, etc., as described herein, further increased etch selectivity of the hard mask may be achieved. When compared to a silicon-doped boron hard mask material that has about 30% of silicon and 65% of boron, which may be referred to as 30% silicon-doped 65% boron hard mask material, in some embodiments, the various hard mask materials described herein may have an etch selectivity relative to the 30% silicon-doped 65% boron hard mask material greater than 1:1, e.g., greater than or about 1.1:1, greater than or about 1.2:1, greater than or about 1.3:1, greater than or about 1.4:1, greater than or about 1.5:1, greater than or about 1.6:1, greater than or about 1.7:1, greater than or about 1.8:1, greater than or about 1.9:1, greater than or about 2:1, or greater in various embodiments. It is noted that although the 30% silicon-doped 65% boron hard mask material is compared with other hard mask materials described herein, the 30% silicon-doped 65% boron hard mask material is also one embodiment of the high boron-content hard mask materials described herein. The comparison is merely discussed herein to aid understanding.

In some embodiments, when the hard mask material may contain a high boron-content of at least 80% of boron and less than 5% of silicon, such as any of the silicon-doped high boron-content hard mask materials described above, the hard mask material may have an etch selectivity relative to the 30% silicon-doped 65% boron hard mask material greater than or about 1.4:1, greater than or about 1.5:1, greater than or about 1.6:1, greater than or about 1.7:1, or greater. When the hard mask material may contain a high boron content or may contain substantially all boron, such as any of the high boron-content hard mask materials described above, e.g., at least 80% of boron with minor hydrogen incorporation but no silicon, the hard mask material may have an etch selectivity relative to the 30% silicon-doped 65% boron hard mask material greater than or about 1.5:1, greater than or about 1.6:1, greater than or about 1.7:1, greater than or about 1.8:1, greater than or about 1.9:1, greater than or about 2:1, or greater. When the hard mask material may contain germanium-doped boron, such as any of the germanium-doped boron materials described above, the germanium-doped boron hard mask material may have an etch selectivity relative to the 30% silicon-doped 65% boron hard mask material greater than or about 1.5:1, greater than or about 1.6:1, greater than or about 1.7:1, greater than or about 1.8:1, or greater. When the hard mask material may contain oxygen-doped boron, such as any of the oxygen-doped boron materials described above, the oxygen-doped boron hard mask material may have an etch selectivity relative to the 30% silicon-doped 65% boron hard mask material greater than or about 1.2:1, greater than or about 1.3:1, greater than or about 1.4:1, greater than or about 1.5:1, or greater. When the hard mask material may contain carbon-doped boron, such as any of the carbon-doped boron materials described above, the carbon-doped boron hard mask material may have an etch selectivity relative to the 30% silicon-doped 65% boron hard mask material greater than or about 1:1, greater than or about 1.1:1, greater than or about 1.2:1, greater than or about 1.3:1, greater than or about 1.4:1, greater than or about 1.5:1, or greater. When the hard mask material may contain nitrogen-doped boron, such as any of the nitrogen-doped boron materials described above, the nitrogen-doped boron hard mask material may have an etch selectivity relative to the 30% silicon-doped 65% boron hard mask material greater than or about 1:1, greater than or about 1.1:1, greater than or about 1.2:1, greater than or about 1.3:1, greater than or about 1.4:1, greater than or about 1.5:1, or greater. When the hard mask material may contain phosphorus-doped boron, such as any of the phosphorus-doped boron materials described above, the phosphorus-doped boron hard mask material may have an etch selectivity relative to the 30% silicon-doped 65% boron hard mask material greater than or about 1:1, greater than or about 1.1:1, greater than or about 1.2:1, greater than or about 1.3:1, greater than or about 1.4:1, greater than or about 1.5:1, or greater.

The improved etch selectivity demonstrated by the various high boron-content hard mask materials may allow for a much thinner hard mask layer 310 to be utilized as compared to conventional hard mask materials. For example, in order to effectively carry out the various etching processes for processing the substrate 305, a hard mask layer formed of amorphous silicon may be required to have a much greater thickness as compared to the hard mask layer 310 formed of the various hard mask materials described herein. To carry out similar etching processes, the thickness of the hard mask layer 310 as described herein may be less than 50%, less than 40%, less than 30% of the thickness of a hard mask layer formed of amorphous silicon. Depending on the applications, the thickness of the hard mask layer 310 described herein may be less than or about 4,000 Å, less than or about 3,500 Å, less than or about 3,000 Å, less than or about 2,500 Å, less than or about 2,000 Å, less than or about 1,500 Å, less than or about 1,000 Å, less than or about 500 Å, or less.

Further, the hard mask layer 310 formed of the various hard mask materials described herein may allow for a much lower extinction coefficient to be obtained. The reduced extinction coefficient may increase the transparency of the hard mask layer 310, which may facilitate substrate alignment during various etching and/or deposition processes. In some embodiments, the hard mask layer 310 may have an extinction coefficient at 633 nm less than 0.3, less than 0.25, less than 0.2, or less. For example, when the hard mask layer 310 may include oxygen-doped boron, the extinction coefficient of the hard mask layer 310 may be less than 0.2, less than 0.19, less than 0.18, less than 0.17, less than 0.16, less than 0.15, less than 0.14, less than 0.13, less than 0.12, less than 0.11, or less. In some embodiments, a further reduced extinction coefficient, e.g., less than 0.1, may be achieved by increasing the oxygen incorporation in the hard mask layer 310, such as up to 20% of oxygen. The increased oxygen content may also allow for a higher deposition rate to be achieved, which may improve process throughput. However, increased oxygen content may lead to reduced etch selectivity. Thus, depending on the application, the oxygen content may be adjusted to achieve reduced extinction coefficient, improved etch selectivity, or a balance of both.

The various hard mask materials described herein may also allow for much higher deposition rates for forming the hard mask layer 310, as compared to the deposition rate offered by conventional hard mask materials, such amorphous silicon. For example, the various hard mask materials described herein may be deposited at a deposition rate greater than or about 5,000 Å/minute, greater than or about 5,500 Å/minute, greater than or about 6,000 Å/minute, greater than or about 6,500 Å/minute, or greater. In contrast, amorphous silicon may only be deposited at a deposition rate of about 2,000 Å/minute.

The various hard mask materials described herein may further provide good mechanical properties, such as high modulus and/or high hardness. For example, the 30% silicon-doped 65% boron hard mask material may be characterized by a modulus over hardness value or an E/H value of about 210/22 Gpa. When the boron content may be increased to at least 80%, such as at least 90% and the silicon content may be limited to less than 5%, such as less than 3%, the silicon-doped high boron-content hard mask material may be characterized by an E/H value of about 252/25 Gpa or greater. When the hard mask material may contain substantially only boron, e.g., at least 90% or at least 95% of boron with minor hydrogen incorporation but no silicon, the hard mask material may be characterized by an E/H value of about 260/26 Gpa or greater. When the hard mask material may be germanium doped and may include high boron content, e.g., at least 80% of boron, such as greater than 85% of boron, the hard mask material may be characterized by an E/H value of 267/27 Gpa or greater.

Tensile stress of about 500 MPa to about 700 MPa, e.g., between about 550 MPa and about 650 MPa, may exist in some of the hard masks formed by some of the hard mask materials described herein. Compressive stress may exist in hard masks formed by conventional hard mask materials. The tensile stress in the hard mask formed by the hard mask materials described herein may be reduced by increasing the plasma power during deposition and/or relaxed via annealing, such as the heating operation 230 as discussed above, subsequent to deposition.

Any number of precursors may be used with the present technology to form high boron-content hard masks. For example, the boron-containing precursor used herein may include boranes, such as borane, diborane, or other multi-center-bonded boron materials, as well as any other boron-containing materials that may be used to produce high boron-content hard masks. The germanium-containing precursor used herein may include any germanium-containing materials, such as germane. The oxygen-containing precursor may include ozone, diatomic oxygen, carbon oxide, such as carbon dioxide, nitrogen oxide, such as dinitrogen monoxide, or other oxygen-containing materials. The silicon-containing precursor used herein may include any silicon-containing materials, such as silane, disilane, and other silicon-containing materials. The carbon-containing precursor used herein may include any carbon-containing materials, such as hydrocarbon, e.g., alkane, alkenes, halogenated alkenes, alkynes, aromatic hydrocarbons, or other carbon-containing materials. The nitrogen-containing precursor may include any nitrogen-containing materials, such as ammonia, pyridine, aliphatic amine, amines, nitriles, or other nitrogen-containing materials. The phosphorus-containing precursor may include any phosphorus-containing materials, such as phosphine.

The processing conditions may also affect the property and/or quality of the hard masks. For example, in some embodiments, when depositing the hard mask layer, the substrate may be maintained at a temperature greater than or about 400° C., and may be maintained at a temperature greater than or about 420° C., greater than or about 440° C., greater than or about 460° C., greater than or about 480° C., greater than or about 500° C., greater than or about 520° C., greater than or about 540° C., greater than or about 550° C., or greater. The inventors have observed that with increased deposition temperatures, increased deposition rates may be achieved, although the stress and/or the extinction coefficient may also increase. Thus, the deposition temperature may be selected to achieve higher deposition rates, lower extinction coefficients, lower stress levels, or a balance of the above. In some embodiments, the substrate may be heated to about 480° C. when depositing the hard mask layer to achieve high deposition rates, while maintaining the extinction coefficient and/or stress in the deposited layer relatively low.

In some embodiments, the plasma may be generated using a capacitively coupled plasma source. The processing pressure during the hard mask deposition may be maintained at less than or about 20 Torr, less than or about 15 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, or less. The plasma power during the hard mask deposition may be maintained between about 100 W and 3,000 W, and may be maintained between about 200 W and about 2,000 W, between about 300 W and about 1,000 W, between about 400 W and about 700 W, or between about 500 W and about 600 W in various embodiments.

In some embodiments, the plasma may be generated using an inductively coupled plasma source. The processing pressure during the hard mask deposition may be maintained between about 1 millitorr and about 200 millitorr. In some embodiments, the processing pressure may be maintained at less than or about 200 millitorrr, less than or about 150 millitorrr, less than or about 100 millitorrr, less than or about 90 millitorrr, less than or about 80 millitorrr, less than or about 70 millitorrr, less than or about 60 millitorrr, less than or about 50 millitorrr, less than or about 40 millitorrr, less than or about 30 millitorrr, less than or about 20 millitorrr, less than or about 10 millitorr, less than or about 9 millitorrr, less than or about 8 millitorrr, less than or about 7 millitorrr, less than or about 6 millitorrr, less than or about 5 millitorrr, less than or about 4 millitorrr, less than or about 3 millitorrr, less than or about 2 millitorrr, or less. The plasma power during the hard mask deposition may be maintained between about 1 kW and about 20 kW, and may be maintained between about 1 kW and about 18 kW, between about 2 kW and about 15 kW, between about 3 kW and about 12 kW, or between about 5 kW and about 10 kW in various embodiments.

To etch the hard mask layer 310, various etching chemistry may be utilized. For example, a fluorine-containing precursor and an oxygen-containing precursor may be flowed into the processing region of the processing chamber to form a plasma to etch the hard mask layer 310. The fluorine-containing precursor may include fluorocarbon or other fluorine-containing precursor. The oxygen-containing precursor may include oxygen, ozone, or other oxygen-containing precursor. The fluorine-containing precursor and the oxygen-containing precursor are described merely as examples, various other etching chemistry may be utilized, depending on the hard mask material and the materials to be etched or preserved relative to the hard mask material. Further, although a plasma dry etch process is described herein as an example, the hard mask materials described herein may also be removed or etched using any appropriate wet etching processes.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:
1. A method, comprising:
   delivering a boron-containing precursor and a germanium-containing precursor to a processing region of a semiconductor processing chamber;
   forming a plasma within the processing region of the semiconductor processing chamber from the boron-containing precursor and the germanium-containing precursor; and
   depositing a boron-containing material on a substrate disposed within the processing region of the semiconductor processing chamber, wherein the boron-contain- ing material comprises greater than 50% of boron, and wherein the boron-containing material comprises less than 20% of germanium.

2. The method of claim 1, wherein the boron-containing precursor comprises only boron and hydrogen.

3. The method of claim 1, further comprising:
delivering an oxygen-containing precursor to the processing region of the semiconductor processing chamber, wherein:
forming the plasma within the processing region of the semiconductor processing chamber further comprising forming the plasma within the processing region of the semiconductor processing chamber from the oxygen-containing precursor; and
the boron-containing material further comprises less than 20% of oxygen.

4. The method of claim 1, further comprising:
delivering a silicon-containing precursor to the processing region of the semiconductor processing chamber, wherein:
forming the plasma within the processing region of the semiconductor processing chamber further comprising forming the plasma within the processing region of the semiconductor processing chamber from the silicon-containing precursor; and
the boron-containing material further comprises less than 5% of silicon.

5. The method of claim 1, wherein the boron-containing precursor is a first precursor, the method further comprising:
delivering a second precursor to the processing region of the semiconductor processing chamber, wherein:
the second precursor comprises at least one of a carbon-containing precursor, a nitrogen-containing precursor, or a phosphorus-containing precursor;
forming the plasma within the processing region of the semiconductor processing chamber further comprising forming the plasma within the processing region of the semiconductor processing chamber from the second precursor; and
the boron-containing material further comprises less than 10% of carbon, nitrogen, or phosphorus.

6. The method of claim 1, wherein the boron-containing material does not include silicon.

7. The method of claim 1, wherein the boron-containing material is characterized by an extinction coefficient of less than 0.3.

8. The method of claim 1, wherein the boron-containing material has an etch selectivity greater than 1.5:1 relative to amorphous silicon.

9. The method of claim 1, wherein the boron-containing material has an etch selectivity greater than 1.5:1 relative to a silicon-doped boron hard mask material that includes about 30% of silicon and about 65% of boron.

10. The method of claim 1, wherein the boron-containing material is deposited at a deposition rate greater than or about 5,000 Å/minute.

11. The method of claim 1, wherein a temperature within the processing region of the semiconductor processing chamber is maintained between about 400° C. and about 550° C.

12. The method of claim 1, further comprising:
delivering a precursor containing nitrogen and hydrogen to the processing region of the semiconductor processing chamber;
forming a plasma from the precursor containing nitrogen and hydrogen; and
treating the substrate with the plasma formed from the precursor containing nitrogen and hydrogen.

13. The method of claim 1, further comprising:
heating the boron-containing material to a temperature ranging between about 500° C. and about 650° C. for a period between about 1 second and about 60 minutes.

14. A method, comprising:
delivering a boron-containing precursor and an oxygen-containing precursor to a processing region of a semiconductor processing chamber;
forming a plasma within the processing region of the semiconductor processing chamber from the boron-containing precursor and the oxygen-containing precursor; and
depositing a boron-containing material on a substrate disposed within the processing region of the semiconductor processing chamber, wherein the boron-containing material comprises greater than 50% of boron, and wherein the boron-containing material comprises less than 20% of oxygen.

15. The method of claim 14, wherein the boron-containing material comprises substantially all boron.

16. The method of claim 14, wherein the boron-containing material does not include silicon.

17. The method of claim 14, further comprising:
delivering a germanium-containing precursor to the processing region of the semiconductor processing chamber, wherein:
forming the plasma within the processing region of the semiconductor processing chamber further comprising forming the plasma within the processing region of the semiconductor processing chamber from the germanium-containing precursor; and
the boron-containing material further comprises less than 20% of germanium.

* * * * *